United States Patent [19]

Ries et al.

[11] Patent Number: 4,673,881
[45] Date of Patent: Jun. 16, 1987

[54] MAGNETIC APPARATUS OF A NUCLEAR SPIN TOMOGRAPHY SYSTEM WITH AN APPROXIMATELY HOLLOW-CYLINDRICAL SHIELDING DEVICE

[75] Inventors: Günther Ries, Erlangen; Karl-Georg Heinzelmann, Neunkirchen, both of Fed. Rep. of Germany

[73] Assignee: Siemens Aktiengesellschaft, Munich, Fed. Rep. of Germany

[21] Appl. No.: 795,430

[22] Filed: Nov. 6, 1985

[30] Foreign Application Priority Data

Nov. 15, 1984 [DE] Fed. Rep. of Germany ....... 3441834

[51] Int. Cl.$^4$ .......................... G01R 33/20; H01F 7/00
[52] U.S. Cl. ..................................... 324/318; 335/301
[58] Field of Search ............... 324/318, 319, 320, 322; 335/299, 301, 214, 216

[56] References Cited

U.S. PATENT DOCUMENTS

| | | | |
|---|---|---|---|
| 3,431,523 | 3/1969 | Donadieu | 335/210 |
| 4,276,529 | 6/1981 | Heinzerling et al. | 335/300 |
| 4,315,216 | 2/1982 | Clow et al. | 324/309 |
| 4,490,675 | 12/1984 | Knuettel et al. | 324/318 |
| 4,498,048 | 2/1985 | Lee et al. | 324/318 |
| 4,585,994 | 4/1986 | Ewing | 324/318 |
| 4,590,428 | 5/1986 | Müller et al. | 324/320 |
| 4,590,452 | 5/1986 | Ries et al. | 335/301 |
| 4,613,820 | 9/1986 | Edelstein et al. | 324/318 |

FOREIGN PATENT DOCUMENTS 0021535 1/1981 European Pat. Off. .

OTHER PUBLICATIONS

Cryogenics, Feb. 1980, vol. 20, No. 2, pp. 59-74.

*Primary Examiner*—Stewart J. Levy
*Assistant Examiner*—Scott M. Oldham
*Attorney, Agent, or Firm*—Kenyon & Kenyon

[57] ABSTRACT

The magnetic apparatus of a nuclear spin tomography system contains several magnet coils which are surrounded by an approximately hollow-cylindrical shielding device of ferromagnetic material. At each end face, this shielding device has a disc-shaped plate with a central opening. Four beam-like shielding elements of identical design having triangular or trapezoidal cross section, arranged distributed in the circumferential direction regularly on a common cylinder surface, extend between these plates at the end faces. With this magnetic apparatus, field distortions caused in the useful volume by the four beam-like shielding elements are substantially reduced. Each shielding element is extended in the outer regions of its base area facing the magnet coils to form a leg part extending toward the adjacent element which is spaced therefrom, which, together with the adjoining side surface of the shielding element, forms a common extended outside surface and has a predetermined thickness in the direction of the normal relative to this outside surface.

4 Claims, 2 Drawing Figures

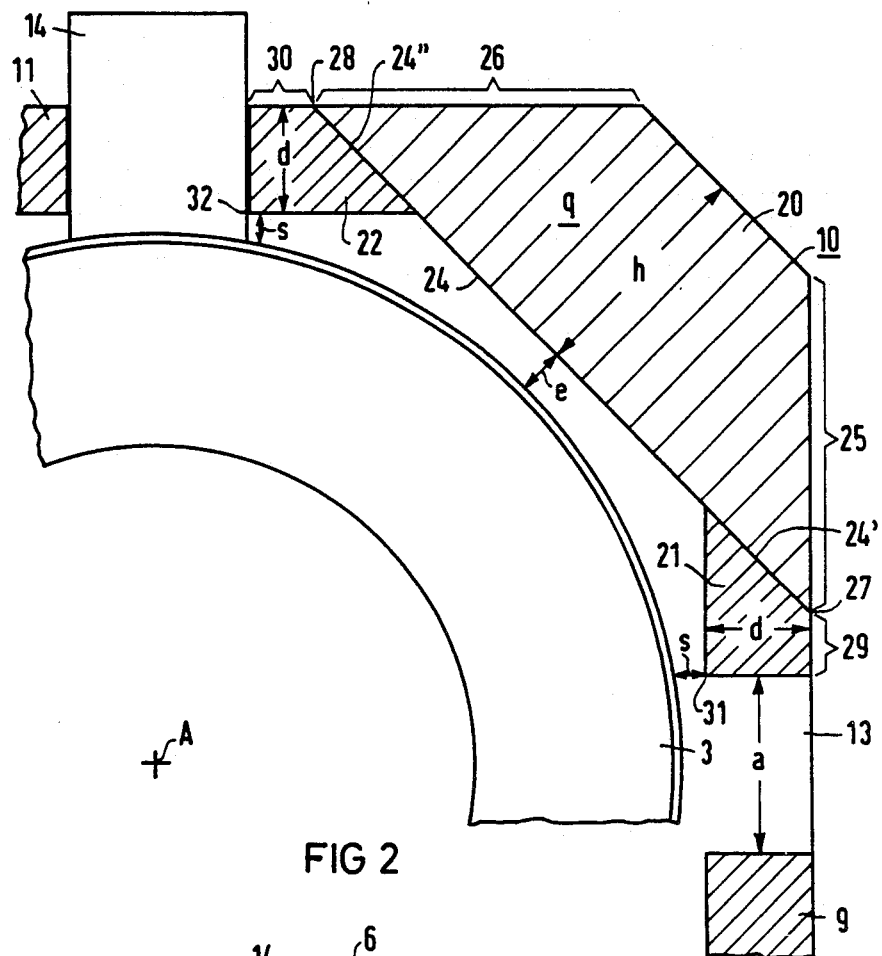
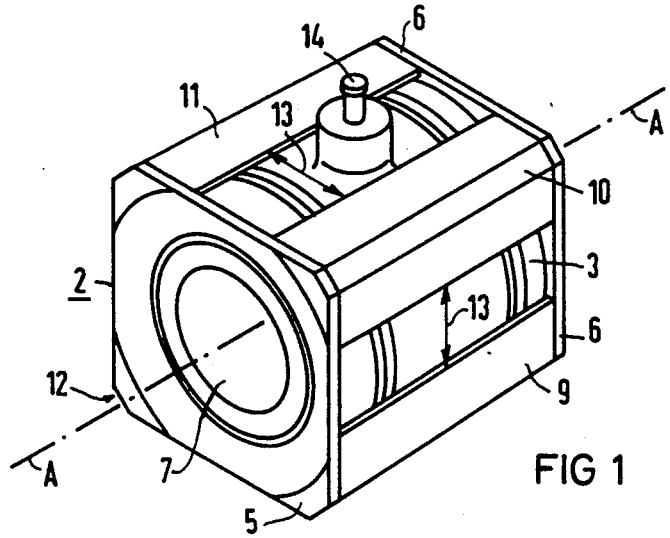

MAGNETIC APPARATUS OF A NUCLEAR SPIN TOMOGRAPHY SYSTEM WITH AN APPROXIMATELY HOLLOW-CYLINDRICAL SHIELDING DEVICE

BACKGROUND OF THE INVENTION

Application No. P 33 33 755.1 The subject of the not yet published German Pat. (U.S. patent application Ser. No. 640,607—filed 8/14/84) is a special magnetic device of a system for nuclear spin tomography which contains several magnet coils which surround an interior suitable for receiving a body to be examined and which produce therein a magnetic field which is at least largely homogeneous. The magnet coils are surrounded by an approximately hollow-cylindrical shielding device of ferromagnetic material. This shielding device has at its respective end faces a disc-shaped plate with a central opening having a predetermined radius relative to the cylinder axis, wherein four beam-like shielding elements of identical design extend, regularly distributed in the circumferential direction, over a common cylinder surface, the cross sectional areas of which are triangular or trapezoidal, and each of which comprises a base area facing the magnet coils and two orthogonally aligned side surfaces adjacent thereto.

Nuclear spin tomography systems (Nuclear Magnetic Resonance (NMR) Systems) for medical diagnostics are generally known (see, for instance, European Pat. No. 21 535 A1 or DE-OS No. 29 21 252). Such installations comprise a magnetic apparatus with an arrangement of normal or, in particular, superconducting field coils, by which a base field as strong as possible can be produced which has adequately high homogeneity in a measuring range. On this base field are superimposed pulsed gradient fields. In addition, a high-frequency field oriented perpendicularly to the base field must be provided.

The dimensions of the corresponding coils must be adapted to the dimensions of the body to be examined in such a manner that the latter can be inserted without problem into the measuring area of the interior surrounded by the coils.

The strong magnetic base field of such a coil arrangement should substantially be limited to the measuring area but should not spread, as far as possible, in the form of a stray field, into the surroundings of the coil arrangement, where it can lead, for instance, to disturbances in certain electromagnetic equipment or can also exert an undesirable force effect on ferromagnetic, especially moving, parts. Magnetic apparatus for nuclear spin tomography therefore advantageously comprises, besides the coil arrangement, also a separate shielding device in order to keep the stray field outside the coil arrangement limited (see DE-OS No. 32 45 945).

With the shielding device proposed by the mentioned patent application, a far-reaching return of the magnetic flux around the coil arrangement of the magnet device can be ensured without the need for closed cylinder surfaces, since such closed surfaces are undesirable expecially if superconducting coils are used. With such coils, lateral openings are required, for instance, for the so-called terminal tower of the necessary cryostat as well as for pump nozzles. In addition, lateral access for an adjustment possibility of the coils for correcting gradient fields should be provided. Accordingly, the cylindrical surface is resolved in the proposed shielding device into four beam-like shielding elements of identical design, which extend between two disc-like plates at the end faces and are arranged, distributed regularly in the circumferential direction together on an imaginary cylinder surface. Even so, the stray field, for instance, of a 1-Tesla magnet can be reduced by such a shielding device by a shielding factor of about 4 to 5.

While with the proposed shielding device, good lateral access to the cryostat and the magnet coils is assured due to the gaps formed between the beam-shaped shielding elements, the concentration of the shielding material in these four shielding elements leads to the situation that the magnetic field in the useful volume suffers a four-numbered field distortion, since under the shielding elements, the field at the edge of the useful field is somewhat greater than in the regions of the gaps between these elements. The four-numbered axis of the shielding is therefore still noticeable in the useful volume as a fourth-order azimuthal error (in a plane perpendicular to the cylinder or magnet axis).

SUMMARY OF THE INVENTION

It is an object of the present invention to improve the shielding device proposed by the magnetic apparatus mentioned above such that with it a reduction of this azimuthal field error is obtained.

The above and other objects of the present invention are achieved by the provision that each shielding element is extended in the edge regions of its base area toward the leg part which extends toward the adjacent element and is spaced therefrom, and forms with the adjoining lateral surface of the shielding element a common outside surface and has a predetermined thickness in the normal direction relative to this outside surface.

Due to this special design of the cross sections of the individual shielding elements which now have two leg parts perpendicularly lined up with respect to each other, an eight-numbered symmetry can largely be simulated with only four beam-shaped shielding elements on the inside of the shielding device, where the size of the variation is substantially only the thickness of these leg parts in the respective direction of the normal. The optimum thickness of the individual leg parts required therefor can be determined without difficulty by calculation or also experimentally. With such an eight-numbered symmetry, the fourth-order azimuthal field error can then be substantially reduced. Since the eighth-order field errors still possible are negligibly small anyhow, the field of the magnet coils shielded in this manner can advantageously be designed practically nearly cylinder-symmetrically.

Other advantages, features and objects of the present invention will be apparent from the description which follows.

BRIEF DESCRIPTION OF THE DRAWINGS

The invention will be explained in greater detail in the following detailed description with reference to the drawings, in which:

FIG. 1 shows a perspective view of a magnetic apparatus with a shielding device according to the invention; and FIG. 2 shows schematically part of a cross sectional view through this device.

DETAILED DESCRIPTION

The magnetic apparatus according to the invention is to be provided for a nuclear spin tomography system (NMR system). It comprises, besides an arrangement of several, particularly superconducting coils, also special components for magnetic shielding and flux return, respectively.

An embodiment of a corresponding device for magnetic shielding is schematically illustrated in FIG. 1. The device comprises an approximately hollow-cylindrical shielding device as was proposed by German Patent Application P 33 33 755.1. The device according to the invention, generally designated with 2, comprises ferromagnetic material and surrounds a cryostat 3, in which the superconducting magnet coils, not shown in the figure, for generating a homogeneous base field with a magnetic flux density of, say, 1 T or more, are arranged. At the end faces of the cryostat 3 are provided solid disc-shaped plates 5 and 6, serving as end poles, each having a round central opening 7. The radius of this central opening 7 at the end plates 5 and 6, which are shaped as equilateral rectangles, is chosen so that on the one hand, sufficient access to the interior of the magnet device is allowed and on the other hand, the field error in the useful volume around the center of the coils is minimized. It is thereby fixed.

The end plates 5 and 6 at the end faces of the shielding device 2 are connected to each other in a magnetically conducting manner via four beam-shaped shielding elements 9 to 12 which extend in the longitudinal direction, i.e., parallel to the central magnetic field axis A. In the presentation of the figure, however, only three of these elements are visible in detail, namely, the elements 9 to 11. The elements 9 to 12 are located, regularly distributed with respect to each other on an imaginary cylinder surface which surrounds the axis A concentrically. All elements have the same shape and a specific cross section which can be seen in detail in FIG. 2.

Together with the plates 5 and 6 at the end faces, the four beam-shaped shielding elements 9 to 12 form a rigid, self-supporting frame, the transverse dimension of which is, in the case of a 1-T magnet coil arrangement, barely larger than the outside diameter of these coils or its cryostat 3. By means of the hollow-cylindrical shielding device 2 formed by this frame, the magnetic flux issuing at the end faces is returned and the stray field of the magnet arrangement is considerably reduced thereby. Within this frame, the magnet coil arrangement is adjustably suspended from the adjusting elements, not detailed in the figure. In addition, however, it is also possible to arrange the magnet coils adjustably on a separate base frame. Since it is sufficient for the purposes of nuclear spin tomography to distribute the cross section of ferromagnetic material required for returning the flux over the four symmetrically arranged beam-shaped shielding elements 9 to 12, a space 13 is advantageously obtained between the individual beam-shaped elements which is available for a terminal tower 14 of the cryostat 3. Since furthermore the required iron cross section of the elements can be accommodated in cross sections which add relatively little radially, the distance between the magnet axis A and the bottom supporting the magnetic device can be kept relatively small. In addition, relatively simple production, assembly and adjustment are possible.

According to the invention, the four shielding elements of the shielding device 2 have a special cross section in order to keep the field distortions in the useful volume of the magnetic apparatus caused by these elements at a minimum. From FIG. 2, in which parts agreeing with FIG. 1 are provided with the same reference symbols, this cross-sectional shape can be seen in detail for one of the shielding elements, for instance, for the element 10. This element can be thought of as composed of a main part 20 with triangular or, in particular, trapezoidal, cross section and two leg parts 21 and 22. According to the assumed embodiment, a trapezoidal shape with equal legs for the main part is assumed. This main part rests tangentially with its base area 24 facing the magnet coils of the cryostat 3 against an imaginary cylinder surface about the cylinder axis A and has two side surfaces 25 and 26 which adjoin the base area 24 and are aligned with each other at right angles. Between these side surfaces 25, 26 as well as the base 24, two corner lines 27 and 28 are formed which each face an adjoining shielding element. The height of the trapezoidal cross section of the main part 20 is designated with h. The shielding element 10 is now extended, according to the invention, deviating from the straight trapezoidal cross section, at the base surface 24 of its main part 20 in edge regions 24' and 24" which are bounded on one side by the corner lines 27 and 28, respectively, by the respective leg part 21 or 22. The outside surfaces 29 and 30 of these leg parts having rectangular trapezoidal cross sections each form a common external surface together with the adjoining side surface 25, 26 of the main part 20 of the shielding element 10. The leg parts 21 and 22 have a predetermined thickness d or trapezoid height of their cross section in the direction of the normal relative to the respective outside surface. Since the distance a between adjacent shielding elements is generally fixed due to the dimensions of the cryostat tower 14 and also the total cross-sectional area q of the shielding elements is given due to the permissible flux density in the material, only the thickness d of the leg parts 21 and 22 can in general be varied within certain limits. Depending on whether the thickness d is larger or smaller, the height h of the trapezoidal cross section of the main part 20 must be chosen correspondignly smaller or larger. A cross-sectional area of the trapezoidal main part 20 is advantageously chosen in proportion to the two cross section areas of the leg parts 21 and 22 in such a way that the minimum distance e between the base area 24 and the outside of the crystat 3 is as large as the corresponding minimum distance s of the leg parts from the cryostat. Preferably, the distance e is always larger than the distance s which exists between the right-angle edges 31 and 32, respectively, of the leg parts 21 and 22. Generally, however, these individual parts will form only one common formed piece.

Besides the assumed trapezoidal form of the cross section of the main parts 20 of the individual shielding elements 9 to 12, a triangular shape may also be provided since, in view of a correction of field errors, the outside contour of the shielding elements is less important as compared to the contour on the inside.

According to a concrete embodiment, a shielding device 2 for a known superconducting 2-T magnet may be provided, the vacuum tank of its cryostat 3 of which has a maximum outside radius of 88 cm, a maximum inside radius of 52.5 cm and a maximum axial len9th of 190 cm. The four shieldin9 elements 9 to 12 are therefore about 196 cm long. The iron cross section required for 2-T of 1.6 m² is uniformly divided over these four shielding elements. The trapezoidal cross section of the main part 20 of each element has a height h of about 40 cm. Between the base surface 24 and the cryostat 3, a minimum distance e of about 6 cm is left empty, while the corresponding minimum distance s of the leg parts 21 and 22 from the cryostat 3 amounts to about 3 cm. The thickness d of the leg parts 21 and 22 is about 18 cm. Between the end faces of the leg parts of adjacent elements facing each other, a distance a of about 30 cm is left free. Through one of the spaces 13 between adjacent shielding elements formed in this manner, the tower 14 of the cryostat 3 with suitable dimensions extends outwardly. The end plates 5 and 6 located at the end faces of the four shielding elements have transverse dimensions of about 220 cm and an axial extent of about 25 cm. They are each provided with a central opening 7, the radius of which is about 84 cm. For fine adjustment, special shielding rings may further be provided, which reduce this radius slightly. All parts of this shielding device 2 may consist of cast steel or relatively plain grades of iron. With this shielding device, a shielding factor (field without iron/field with iron) of about 4 to 5 is achieved. Due to the special shape of the cross section of the individual shielding elements, the field distortions in the azimuthal direction are then less than 1 ppm.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. Magnetic apparatus of a system for nuclear spin tomography having a plurality of magnet coils which surround an interior space suitable for receiving a body to be examined and which generate therein an at least largely homogeneous magnetic field, and having an approximately hollow-cylindrical shielding device of ferromagnetic material which surrounds the magnet coils, the shielding device having at each of its end faces a disc-shaped plate with a central opening having a predetermined radius relative to the cylinder axis, and further comprising four beam-like shielding elements of substantially identical design arranged regularly distributed in the circumferential direction on a common cylinder surface extending between said end face plates, the cross sectional areas of said shielding elements being of triangular or trapezoidal shape, each of said shielding elements having a base surface facing the magnet coils and two adjoining outer side surfaces which are aligned at right angles to each other, each shielding element being extended in outer regions of the base surface with leg parts extending toward the adjoining shielding elements and spaced therefrom, said leg part forming with an adjoining side surface of the shielding element, a common extended outer side surface of the shielding elements, said leg parts having a predetermined thickness in the direction of a normal line with respect to said outer side surface.

2. Magnetic apparatus as recited in claim 1 having superconducting magnet coils which are arranged in a hollow-cylindrical cryostat, wherein the minimum distance between the cryostat and the base area of the respective shielding element is at least as large as the distance of the portions of the leg parts closest to the cryostat.

3. Magnetic apparatus as recited in claim 1, wherein the leg parts have cross-sectional areas of semi-trapezoidal form, the predetermined thickness of the leg parts being the height of the semi-trapezoidal form.

4. Magnetic apparatus as recited in claim 1, wherein the leg parts and the associated triangular or trapezoidal shielding element forms a common integral part.

* * * * *